United States Patent
Hsieh et al.

(10) Patent No.: US 10,056,417 B2
(45) Date of Patent: Aug. 21, 2018

(54) IMAGE-SENSOR STRUCTURES

(71) Applicant: VisEra Technologies Company Limited, Hsin-Chu (TW)

(72) Inventors: Chin-Chuan Hsieh, Hsin-Chu (TW); Yu-Kun Hsiao, Hsin-Chu (TW); Wei-Ko Wang, Taoyuan (TW); Li-Kai Lee, New Taipei (TW)

(73) Assignee: Visera Technologies Company Limited, Hsin-Chu (TW)

( * ) Notice: Subject to any disclaimer, the term of this patent is extended or adjusted under 35 U.S.C. 154(b) by 0 days.

(21) Appl. No.: 15/066,948

(22) Filed: Mar. 10, 2016

(65) Prior Publication Data

US 2017/0263662 A1 Sep. 14, 2017

(51) Int. Cl.
*H01L 31/0232* (2014.01)
*H01L 27/146* (2006.01)

(52) U.S. Cl.
CPC .. *H01L 27/14621* (2013.01); *H01L 27/14625* (2013.01); *H01L 27/14627* (2013.01); *H01L 27/14645* (2013.01)

(58) Field of Classification Search
CPC .................................................. H01L 27/14621
USPC .......................................................... 257/432
See application file for complete search history.

(56) References Cited

U.S. PATENT DOCUMENTS

| | | | | |
|---|---|---|---|---|
| 2009/0147101 A1* | 6/2009 | Tatani | ........... | H01L 27/14621 348/224.1 |
| 2011/0102547 A1* | 5/2011 | Sul | ........... | H01L 27/14621 348/46 |
| 2011/0128423 A1* | 6/2011 | Lee | ........... | H01L 27/14621 348/294 |
| 2015/0381907 A1* | 12/2015 | Boettiger | ........... | H04N 5/332 348/164 |
| 2016/0035775 A1* | 2/2016 | Choi | ........... | H01L 27/14621 257/432 |

(Continued)

FOREIGN PATENT DOCUMENTS

| | | |
|---|---|---|
| CN | 103839952 A | 6/2014 |
| CN | 103915455 A | 7/2014 |
| JP | 2007242877 A | 9/2007 |

(Continued)

OTHER PUBLICATIONS

Office Action of its corresponding JP application No. 2016-112467 dated Mar. 7, 2017 with its English translation (25 pgs.).

(Continued)

*Primary Examiner* — Igwe U Anya
(74) *Attorney, Agent, or Firm* — Muncy, Geissler, Olds & Lowe, P.C.

(57) ABSTRACT

An image-sensor structure is provided. The image-sensor structure includes a substrate with a plurality of photoelectric conversion units formed therein, a plurality of color filters formed above the substrate, wherein the color filters are divided into red color filters, green color filters and blue color filters, a plurality of microlenses correspondingly formed above the color filters, a transparent material layer formed above the microlenses, a first filter blocking infrared (IR) light formed above the transparent material layer, a second filter allowing transmission of visible light formed above the first filter, and a lens module formed above the second filter.

14 Claims, 10 Drawing Sheets

(56) References Cited

U.S. PATENT DOCUMENTS

2016/0116653 A1\* 4/2016 Murayama ........ H01L 27/14618
359/359
2016/0133762 A1\* 5/2016 Blasco Claret ... H01L 27/14685
257/432

FOREIGN PATENT DOCUMENTS

| JP | 2010256633 A | 11/2010 |
| JP | 2013-169713 A | 9/2013 |
| JP | 2015128127 A | 7/2015 |
| JP | 2015203863 A | 11/2015 |
| TW | 201138076 A | 11/2011 |
| TW | 201604592 A | 2/2016 |
| WO | WO-2014/041742 A1 | 3/2014 |
| WO | WO-2014/061188 A1 | 4/2014 |

OTHER PUBLICATIONS

Office Action and the search report of its corresponding TW application No. 105142205 dated Mar. 22, 2017 (6 pgs.).
The Office Action of its corresponding JP application No. 2016-112467 dated Aug. 8, 2017 with its English translation (18 pgs.).

\* cited by examiner

IMAGE-SENSOR STRUCTURES

BACKGROUND OF THE INVENTION

Field of the Invention

The invention relates to an image-sensor structure, and more particularly to an image-sensor structure with a hybrid filter.

Description of the Related Art

An image sensor is a kind of semiconductor device that transforms optical images into electrical signals. Image sensors can be generally classified into charge coupled devices (CCDs) and complementary metal oxide semiconductor (CMOS) image sensors. Among these image sensors, a CMOS image sensor comprises a photodiode for detecting incident light and transforming it into electrical signals, and logic circuits for transmitting and processing the electrical signals.

In an RGB camera module with a silicon-based image sensor such as CCD or CMOS, an IR-cut filter for cutting near infrared (IR) light is coated on a glass and assembled in a lens module. The lens module is then mounted on the image sensor. However, the IR-cut filter manufactured using multi-film interference technology causes a blue shift to occur.

In an RGB-IR camera module, the IR-cut filter is replaced with a dual band pass filter on a glass. The dual band pass filter manufactured by the multi-film interference technology presents a visible band and a narrow infrared band. For an RGB pixel, its color filters receive visible light and a little infrared light (noise). For an IR pixel, its color filters receive infrared light only.

There are two solutions currently employed to overcome the blue shift issue. One solution is the adoption of blue glass. The other solution is the adoption of a hybrid filter on bare glass. However, the minimum thickness of the blue glass is 0.3 mm. The hybrid filter on bare glass also needs the glass to be at least 0.15 mm thick. The total thickness of the camera is always a problem in smartphones. Additionally, adoption of the dual band pass filter on a glass also addresses the thickness problem.

Therefore, the development of a thin image-sensor structure that does not lead to blue shift is desirable.

BRIEF SUMMARY OF THE INVENTION

One embodiment of the invention provides an image-sensor structure comprising a substrate with a plurality of photoelectric conversion units formed therein; a plurality of color filters formed above the substrate, wherein the color filters are divided into red color filters, green color filters and blue color filters; a plurality of microlenses correspondingly formed above the color filters; a transparent material layer formed above the microlenses; a first filter blocking infrared (IR) light formed above the transparent material layer; a second filter allowing transmission of visible light formed above the first filter; and a lens module formed above the second filter.

In some embodiments, the photoelectric conversion unit comprises a photodiode (PD).

In some embodiments, the transparent material layer has a refractive index lower than that of the microlens and the first filter.

In some embodiments, the transparent material layer has a refractive index lower than 1.3.

In some embodiments, the first filter blocks the infrared (IR) light having a wavelength ranging from 700 nm to 800 nm, 700 nm to 900 nm, 700 nm to 1,000 nm or 800 nm to 900 nm.

In some embodiments, the second filter allows transmission of the visible light having a wavelength ranging from 400 nm to 700 nm.

In some embodiments, the second filter comprises multiple films with alternating high and low refractive index.

One embodiment of the invention provides an image-sensor structure comprising a substrate with a plurality of photoelectric conversion units formed therein; a plurality of color filters formed above the substrate, wherein the color filters are divided into red color filters, green color filters, blue color filters and infrared pass filters; a plurality of microlenses correspondingly formed above the color filters; a first transparent material layer formed above the microlenses; a first filter blocking infrared (IR) light partially formed above the first transparent material layer, exposing a part of the first transparent material layer corresponding to the infrared pass filters; a second filter allowing transmission of visible light formed above the first filter, exposing the part of the first transparent material layer corresponding to the infrared pass filters; a second transparent material layer formed above the part of the first transparent material layer corresponding to the infrared pass filters; and a lens module formed above the second filter and the second transparent material layer.

In some embodiments, the infrared (IR) pass filter allows transmission of infrared (IR) light.

In some embodiments, the first transparent material layer has a refractive index lower than that of the microlens and the first filter.

In some embodiments, the first transparent material layer has a refractive index lower than 1.3.

One embodiment of the invention provides an image-sensor structure comprising a substrate with a plurality of photoelectric conversion units formed therein; a plurality of color filters formed above the substrate, wherein the color filters are divided into red color filters, green color filters, blue color filters and infrared pass filters; a plurality of microlenses correspondingly formed above the color filters; a transparent material layer formed above the microlenses; a first filter blocking infrared (IR) light formed above the transparent material layer, wherein the first filter blocks the infrared (IR) light having a first wavelength range; a second filter allowing transmission of visible light and infrared (IR) light formed above the first filter, wherein the second filter allows transmission of the visible light and the infrared (IR) light having a second wavelength range, wherein the second wavelength range is larger than the first wavelength range; and a lens module formed above the second filter.

In some embodiments, the first wavelength range is from 700 nm to 800 nm or from 700 nm to 900 nm.

In some embodiments, the second wavelength range is from 400 nm to 900 nm or from 400 nm to 1,000 nm.

In some embodiments, the image-sensor structure further comprises a third filter blocking infrared (IR) light formed between the red color filters, the green color filters and the blue color filters, and the substrate, or between the red color filters, the green color filters and the blue color filters, and the microlenses.

In some embodiments, the third filter blocks the infrared (IR) light having a wavelength of 850 nm or 940 nm.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
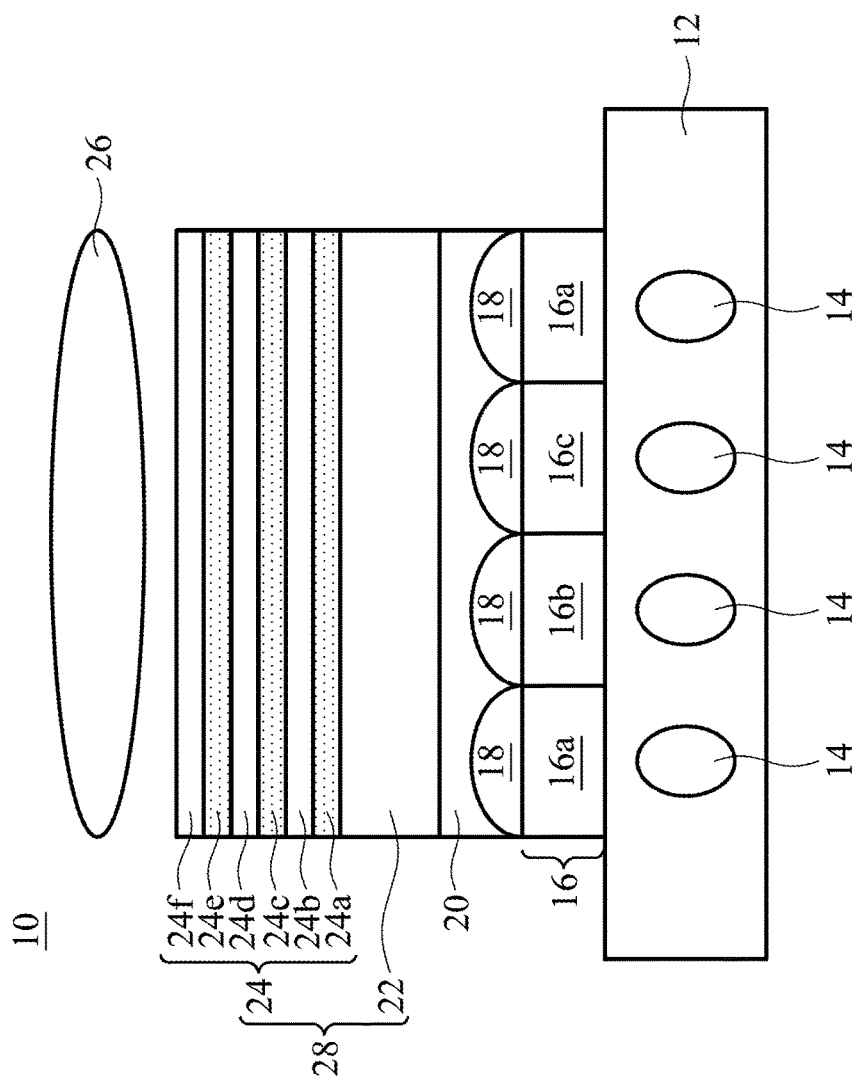
FIG. 1 is a cross-sectional view of an image-sensor structure in accordance with one embodiment of the invention.

Referring to FIG. 1, in accordance with one embodiment of the invention, an image-sensor structure 10 is provided. FIG. 1 is a cross-sectional view of the image-sensor structure 10.

The image-sensor structure 10 comprises a substrate 12 with a plurality of photoelectric conversion units 14 formed in the substrate 12. A plurality of color filters 16 are formed above the substrate 12. The color filters 16 are divided into red color filters 16a, green color filters 16b and blue color filters 16c. A plurality of microlenses 18 are correspondingly formed above the color filters 16. A transparent material layer 20 is formed above the microlenses 18. A first filter 22 blocking infrared (IR) light is formed above the transparent material layer 20. A second filter 24 allowing transmission of visible light is formed above the first filter 22. Additionally, a lens module 26 is formed above the second filter 24.

In some embodiments, the photoelectric conversion unit 14 may comprise a photodiode (PD).

In some embodiments, the transparent material layer 20 may have a refractive index which is about lower than the refractive index of the microlens 18 and the first filter 22.

In some embodiments, the transparent material layer 20 may have a refractive index which is about lower than 1.3, for example, about lower than the refractive index of silicon oxide.

Figure 2:
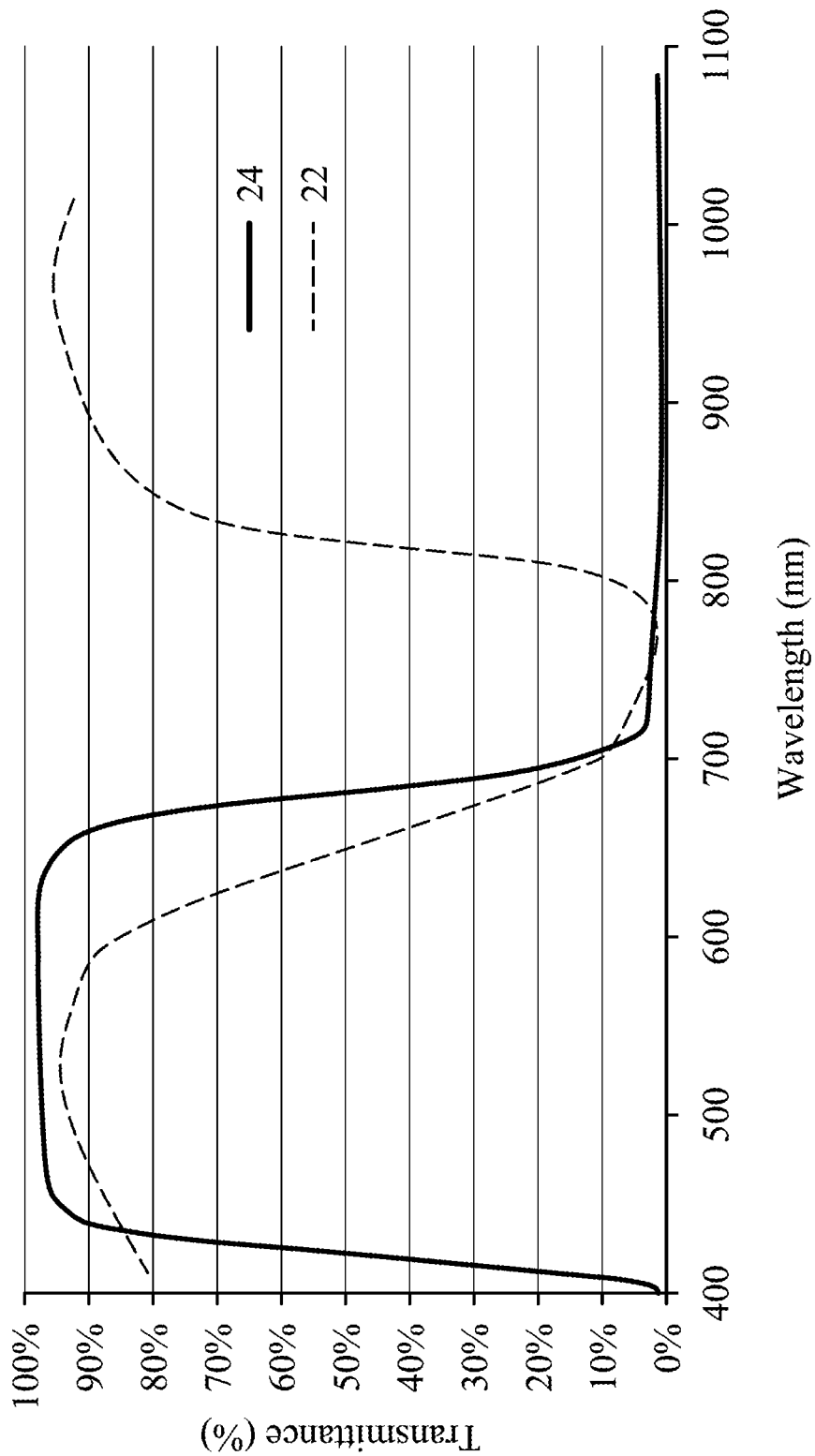
FIG. 2 shows the relationship between the transmittance (% T) and the wavelength (nm) of light with regard to the first filter and the second filter in accordance with one embodiment of the invention.

In some embodiments, the first filter 22 blocks the infrared (IR) light which has a wavelength ranging from about 700 nm to about 800 nm, about 700 nm to about 900 nm, about 700 nm to about 1,000 nm or about 800 nm to about 900 nm. For example, the first filter 22 selectively blocks the infrared (IR) light which has a wavelength ranging from about 700 nm to about 800 nm (see a curve 22 presented by the first filter 22 in FIG. 2). FIG. 2 shows the relationship between the transmittance (% T) and the wavelength (nm) of light with regard to the first filter 22 and the second filter 24.

In some embodiments, the second filter 24 allows transmission of the visible light which has a wavelength ranging from about 400 nm to about 700 nm. For example, the second filter 24 selectively allows transmission of the visible light which has a wavelength ranging from about 400 nm to about 700 nm (see a curve 24 presented by the second filter 24 in FIG. 2).

In some embodiments, the second filter 24 may comprise multiple films, for example, six films 24a, 24b, 24c, 24d, 24e and 24f with alternating high and low refractive index, as shown in FIG. 1, and a specific metal film, such like Ag, Al . . . etc.

In FIG. 1, in the image-sensor structure 10, a hybrid filter 28 constituted by the first filter 22 and the second filter 24 is directly disposed on a sensor chip and is capable of cutting the infrared (IR) light with the specific wavelength (i.e. about 700 nm to about 1,100 nm) and allowing the visible light with the specific wavelength (i.e. about 400 nm to about 700 nm) passing through the color filters 16 comprising the red color filters 16a, the green color filters 16b and the blue color filters 16c without formation of blue shift or tiny blue shift.

Figure 3:
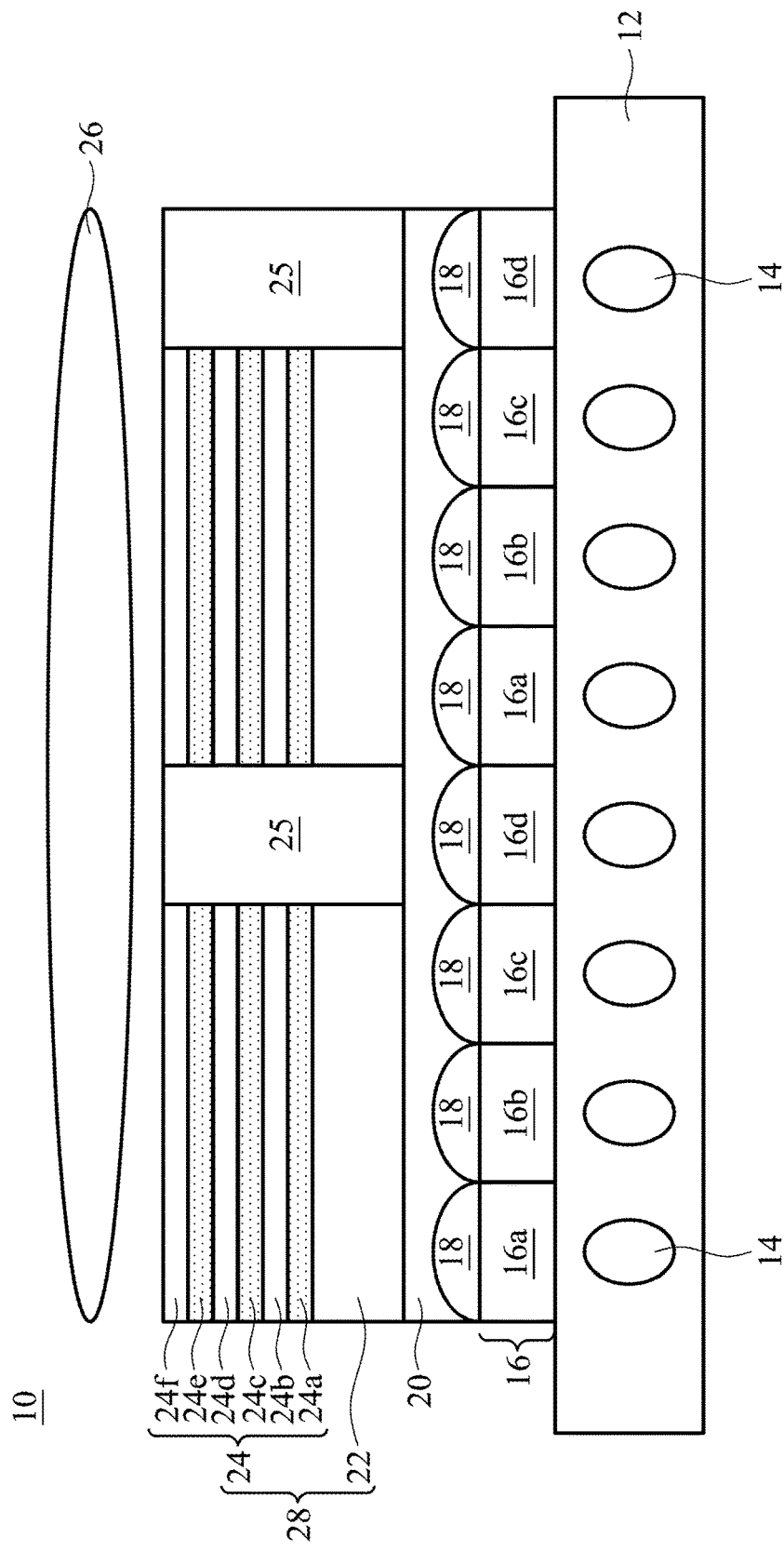
FIG. 3 is a cross-sectional view of an image-sensor structure in accordance with one embodiment of the invention.

Referring to FIG. 3, in accordance with one embodiment of the invention, an image-sensor structure 10 is provided. FIG. 3 is a cross-sectional view of the image-sensor structure 10.

The image-sensor structure 10 comprises a substrate 12 with a plurality of photoelectric conversion units 14 formed in substrate 12. A plurality of color filters 16 is formed above the substrate 12. The color filters 16 are divided into red color filters 16a, green color filters 16b, blue color filters 16c and infrared pass filters 16d. A plurality of microlenses 18 are correspondingly formed above the color filters 16. A first transparent material layer 20 is formed above the microlenses 18. A first filter 22 blocking infrared (IR) light is partially formed above the first transparent material layer 20, exposing a part of the first transparent material layer 20 corresponding to the infrared pass filters 16d. A second filter 24 allowing transmission of visible light is formed above the first filter 22, exposing the part of the first transparent material layer 20 corresponding to the infrared pass filters 16d. Specifically, a second transparent material layer 25 is formed above the part of the first transparent material layer 20 corresponding to the infrared pass filters 16d. Additionally, a lens module 26 is formed above the second filter 24 and the second transparent material layer 25.

In some embodiments, the photoelectric conversion unit 14 may comprise a photodiode (PD).

In some embodiments. the infrared (IR) pass filter 16d allows transmission of infrared (IR) light.

In some embodiments, the first transparent material layer 20 may have a refractive index which is about lower than the refractive index of the microlens 18 and the first filter 22.

In some embodiments, the first transparent material layer 20 may have a refractive index which is about lower than 1.3, for example, about lower than the refractive index of silicon oxide.

Figure 4:
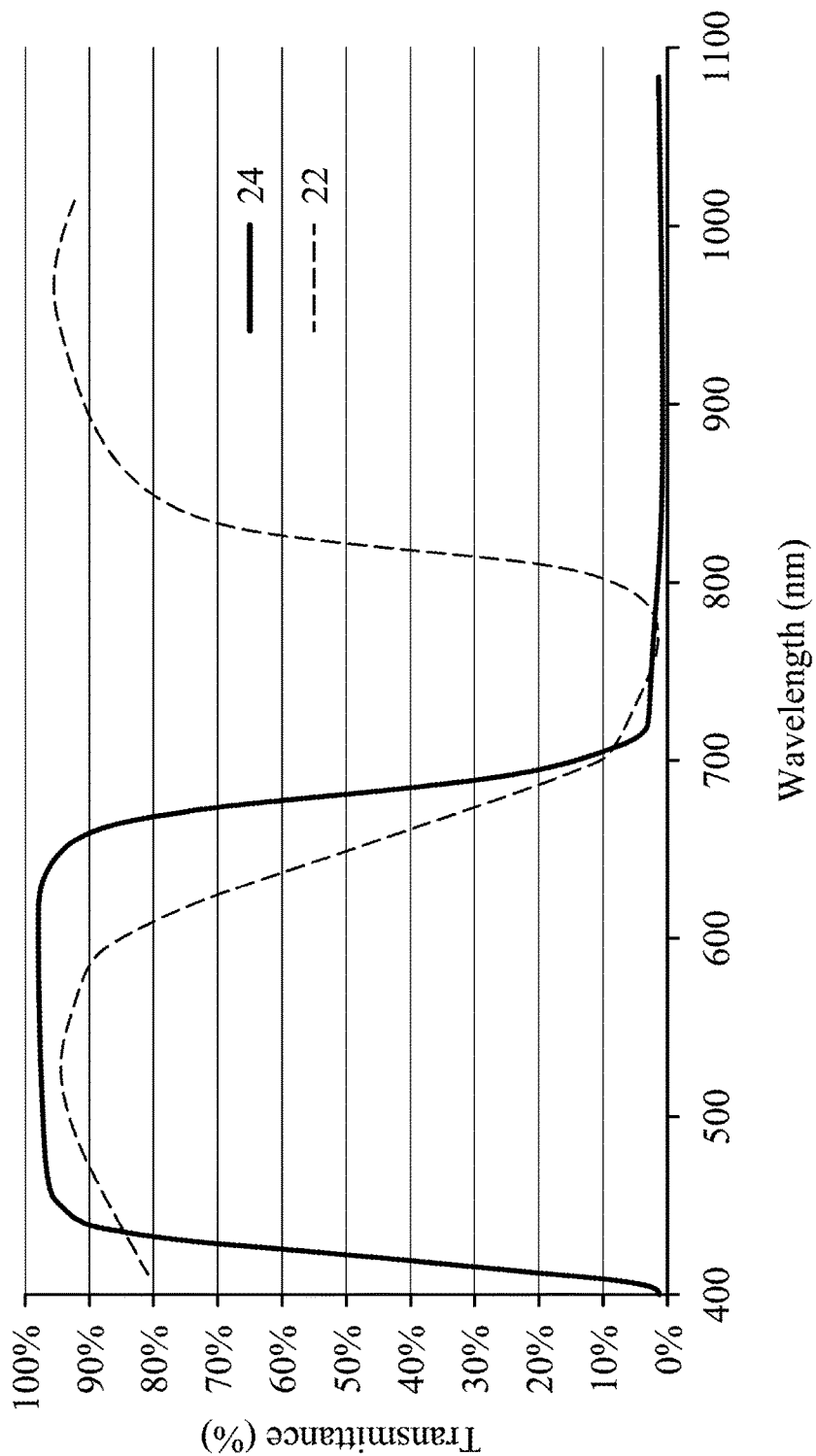
FIG. 4 shows the relationship between the transmittance (% T) and the wavelength (nm) of light with regard to the first filter and the second filter in accordance with one embodiment of the invention.

In some embodiments, the first filter 22 blocks the infrared (IR) light which has a wavelength ranging from about 700 nm to about 800 nm, about 700 nm to about 900 nm, about 700 nm to about 1,000 nm or about 800 nm to about 900 nm. For example, the first filter 22 selectively blocks the infrared (IR) light which has a wavelength ranging from about 700 nm to about 800 nm (see a curve 22 presented by the first filter 22 in FIG. 4). FIG. 4 shows the relationship between the transmittance (% T) and the wavelength (nm) of light with regard to the first filter 22 and the second filter 24.

In some embodiments, the second filter 24 allows transmission of the visible light which has a wavelength ranging from about 400 nm to about 700 nm. For example, the second filter 24 selectively allows transmission of the visible light which has a wavelength ranging from about 400 nm to about 700 nm (see a curve 24 presented by the second filter 24 in FIG. 4).

In some embodiments, the second filter 24 may comprise multiple films, for example, six films 24a, 24b, 24c, 24d, 24e and 24f with alternating high and low refractive index, as shown in FIG. 3, and a specific metal film, such like Ag, Al . . . etc.

In some embodiments, the second transparent material layer 25 which is formed above the part of the first transparent material layer 20 corresponding to the infrared pass filters 16d allows transmission of the infrared (IR) light and the visible light.

In FIG. 3, in the image-sensor structure 10, a hybrid filter 28 constituted by the first filter 22 and the second filter 24 is directly disposed on a sensor chip and is capable of cutting the infrared (IR) light with the specific wavelength (i.e. about 700 nm to about 1,100 nm) and allowing the visible light with the specific wavelength (i.e. about 400 nm to about 700 nm) passing through the red color filters 16a, the green color filters 16b and the blue color filters 16c. Additionally, the second transparent material layer 25 is formed above the part of the first transparent material layer 20 corresponding to the infrared pass filters 16d and is capable of allowing the infrared (IR) light with the specific wavelength (i.e. about 800 nm to about 1,100 nm, about 900 nm to about 1,100 nm, about 1,000 nm to about 1,100 nm) passing through the infrared pass filters 16d without formation of blue shift or tiny blue shift.

Figure 5:
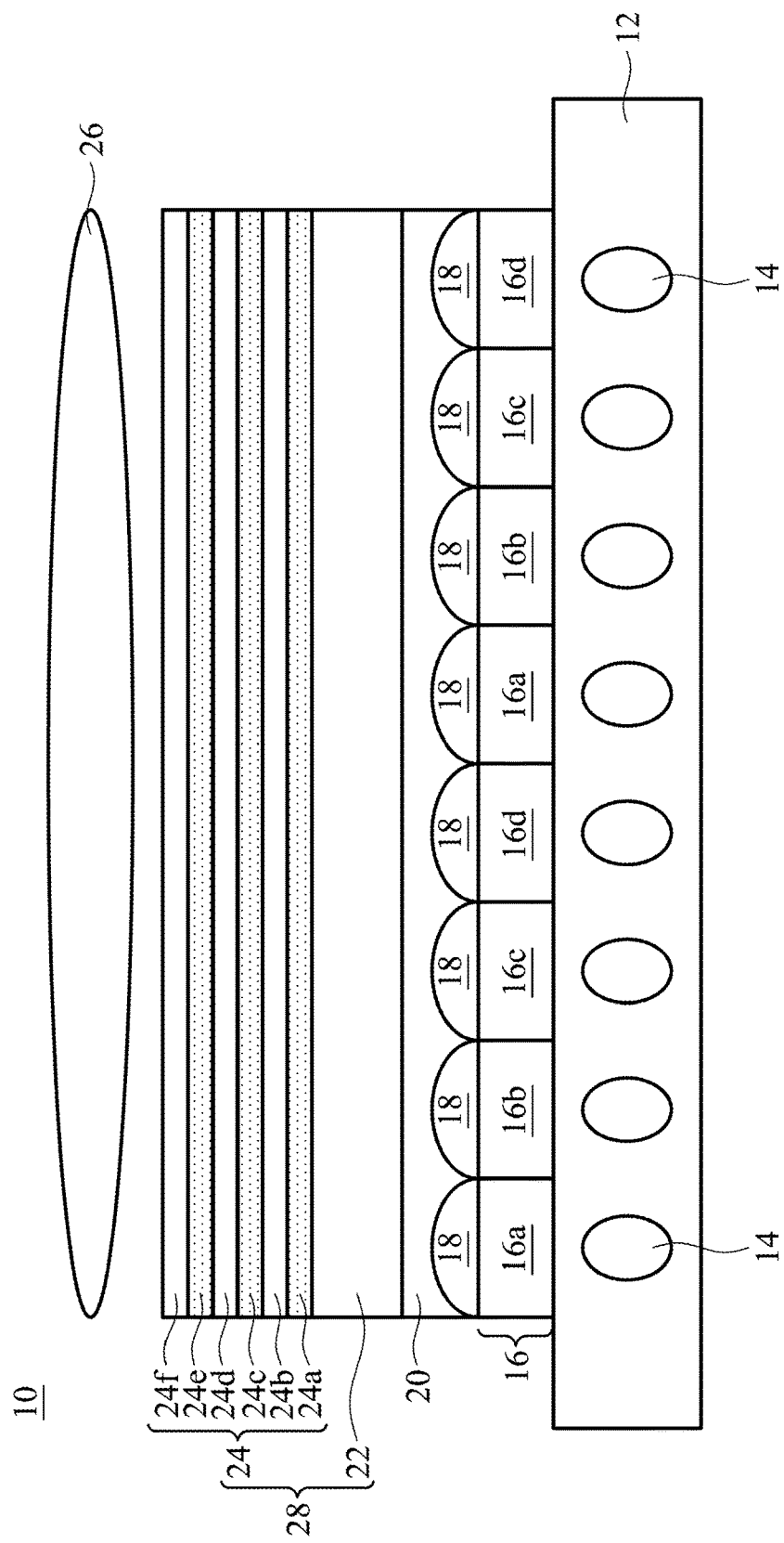
FIG. 5 is a cross-sectional view of an image-sensor structure in accordance with one embodiment of the invention.

Referring to FIG. 5, in accordance with one embodiment of the invention, an image-sensor structure 10 is provided. FIG. 5 is a cross-sectional view of the image-sensor structure 10.

The image-sensor structure 10 comprises a substrate 12 with a plurality of photoelectric conversion units 14 formed in the substrate 12. A plurality of color filters 16 is formed above the substrate 12. The color filters 16 are divided into red color filters 16a, green color filters 16b, blue color filters 16c and infrared pass filters 16d. A plurality of microlenses 18 are correspondingly formed above the color filters 16. A transparent material layer 20 is formed above the microlenses 18. A first filter 22 blocking infrared (IR) light is formed above the transparent material layer 20. The first filter 22 blocks the infrared (IR) light having a first wavelength range. A second filter 24 allowing transmission of visible light and infrared (IR) light is formed above the first filter 22. The second filter 24 allows transmission of the visible light and the infrared (IR) light having a second wavelength range. Specifically, the second wavelength range is larger than the first wavelength range. A lens module 26 is formed above the second filter 24.

In some embodiments, the photoelectric conversion unit 14 may comprise a photodiode (PD).

In some embodiments, the infrared (IR) pass filter 16d allows transmission of infrared (IR) light.

In some embodiments, the transparent material layer 20 may have a refractive index which is about lower than the refractive index of the microlens 18 and the first filter 22.

In some embodiments, the transparent material layer 20 may have a refractive index which is about lower than 1.3, for example, about lower than the refractive index of silicon oxide.

Figure 6:
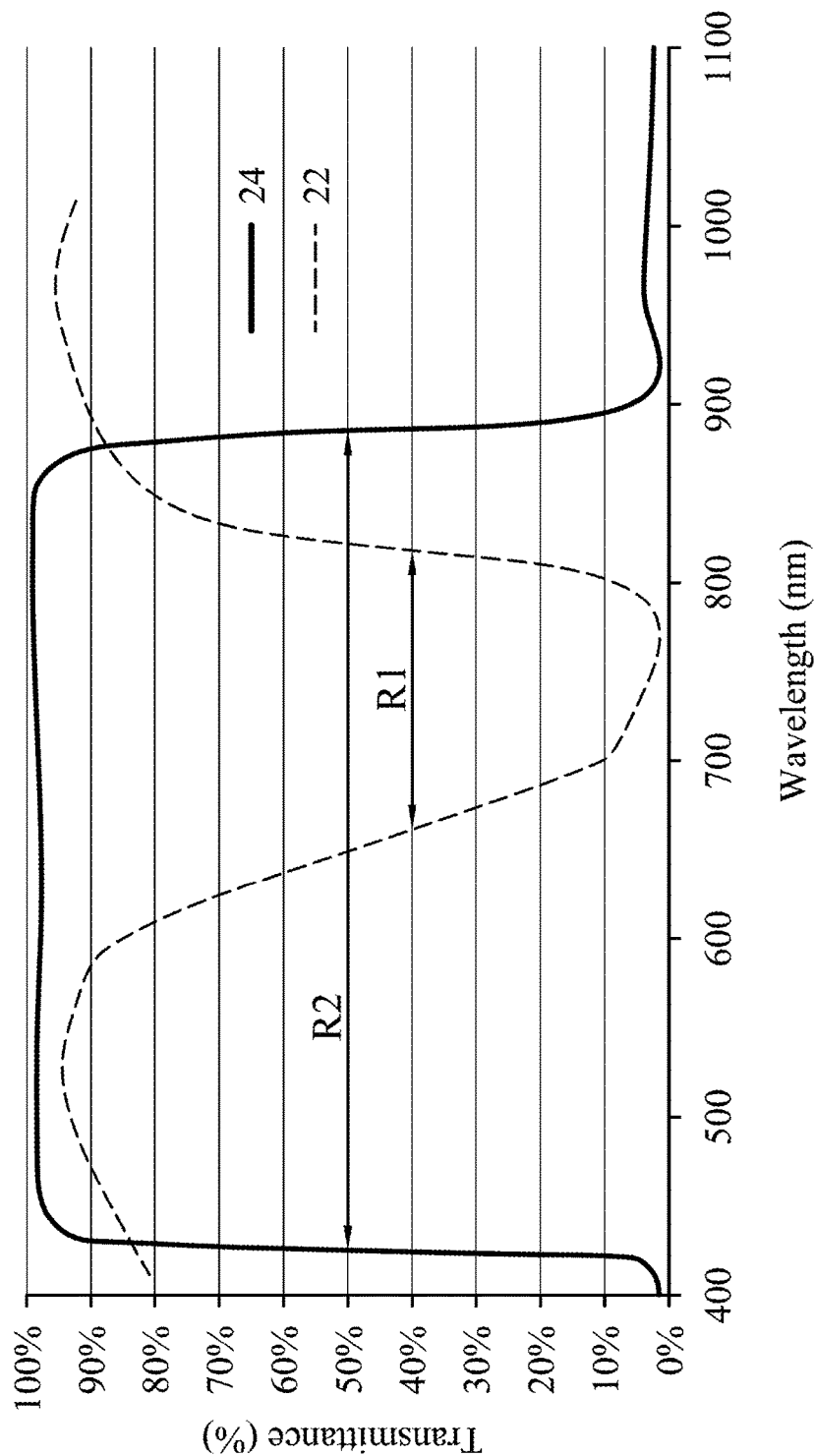
FIG. 6 shows the relationship between the transmittance (% T) and the wavelength (nm) of light with regard to the first filter and the second filter in accordance with one embodiment of the invention.

In some embodiments, referring to FIG. 6, the first wavelength range R1 of the infrared (IR) light blocked by the first filter 22 is from about 700 nm to about 800 nm or from about 700 nm to about 900 nm. That is, the first filter 22 selectively blocks the infrared (IR) light which has a wavelength ranging from about 700 nm to about 800 nm (see a curve 22 presented by the first filter 22 in FIG. 6). FIG. 6 shows the relationship between the transmittance (% T) and the wavelength (nm) of light with regard to the first filter 22 and the second filter 24.

In some embodiments, the second wavelength range R2 of the visible light and the infrared (IR) light transmitted allowed by the second filter 24 is from about 400 nm to about 900 nm or from about 400 nm to about 1,000 nm. That is, the second filter 24 selectively allows transmission of the visible light and the infrared (IR) light which have wavelengths ranging from about 400 nm to about 900 nm (see a curve 24 presented by the second filter 24 in FIG. 6). Specifically, when the first filter 22 and the second filter 24 are hybridized, a dual band pass profile is fouled due to the second wavelength range R2 being larger than the first wavelength range R1.

In some embodiments, the second filter 24 may comprise multiple films, for example, six films 24a, 24b, 24c, 24d, 24e and 24f with alternating high and low refractive index, as shown in FIG. 5, and a specific metal film, such like Ag, Al . . . etc.

In FIG. 5, in the image-sensor structure 10, a hybrid dual band pass filter 28 constituted by the first filter 22 and the second filter 24 is directly disposed on a sensor chip and is capable of cutting the infrared (IR) light with the specific wavelength (i.e. about 700 nm to about 800 nm) and allowing the visible light with the specific wavelength (i.e. about 400 nm to about 700 nm) and the infrared (IR) light with the specific wavelength (i.e. about 850 nm or about 940 nm) passing through the red color filters 16a, the green color filters 16b and the blue color filters 16c. Similarly, the hybrid dual band pass filter 28 is capable of allowing the infrared (IR) light with the specific wavelength (i.e. about 850 nm or about 940 nm) passing through the infrared pass filters 16d without formation of blue shift.

Figure 7:
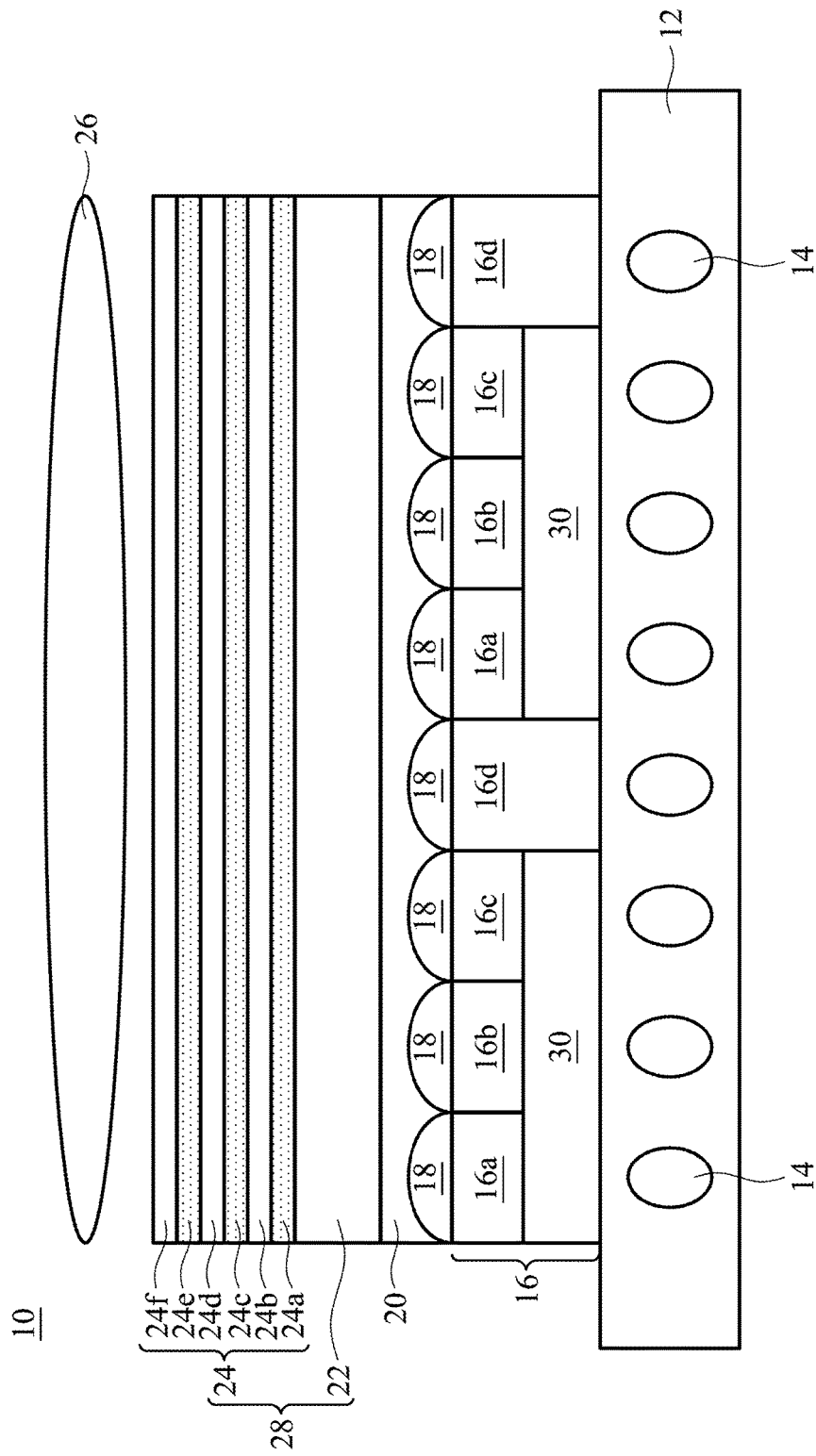
FIG. 7 is a cross-sectional view of an image-sensor structure in accordance with one embodiment of the invention.

Referring to FIG. 7, in accordance with one embodiment of the invention, an image-sensor structure 10 is provided. FIG. 7 is a cross-sectional view of the image-sensor structure 10.

The image-sensor structure 10 comprises a substrate 12 with a plurality of photoelectric conversion units 14 formed in the substrate 12. A plurality of color filters 16 is formed above the substrate 12. The color filters 16 are divided into red color filters 16a, green color filters 16b, blue color filters 16c and infrared pass filters 16d. A plurality of microlenses 18 are correspondingly formed above the color filters 16. A transparent material layer 20 is formed above the microlenses 18. A first filter 22 blocking infrared (IR) light is formed above the transparent material layer 20. The first filter 22 blocks the infrared (IR) light having a first wavelength range. A second filter 24 allowing transmission of visible light and infrared (IR) light is formed above the first filter 22. The second filter 24 allows transmission of the visible light and the infrared (IR) light having a second wavelength range. Specifically, the second wavelength range is larger than the first wavelength range. A lens module 26 is formed above the second filter 24.

In some embodiments, the photoelectric conversion unit 14 may comprise a photodiode (PD).

In some embodiments, the infrared (IR) pass filter 16d allows transmission of infrared (IR) light.

In some embodiments, the transparent material layer 20 may have a refractive index which is about lower than the refractive index of the microlens 18 and the first filter 22.

In some embodiments, the transparent material layer 20 may have a refractive index which is about lower than 1.3, for example, about lower than the refractive index of silicon oxide.

Figure 8A:
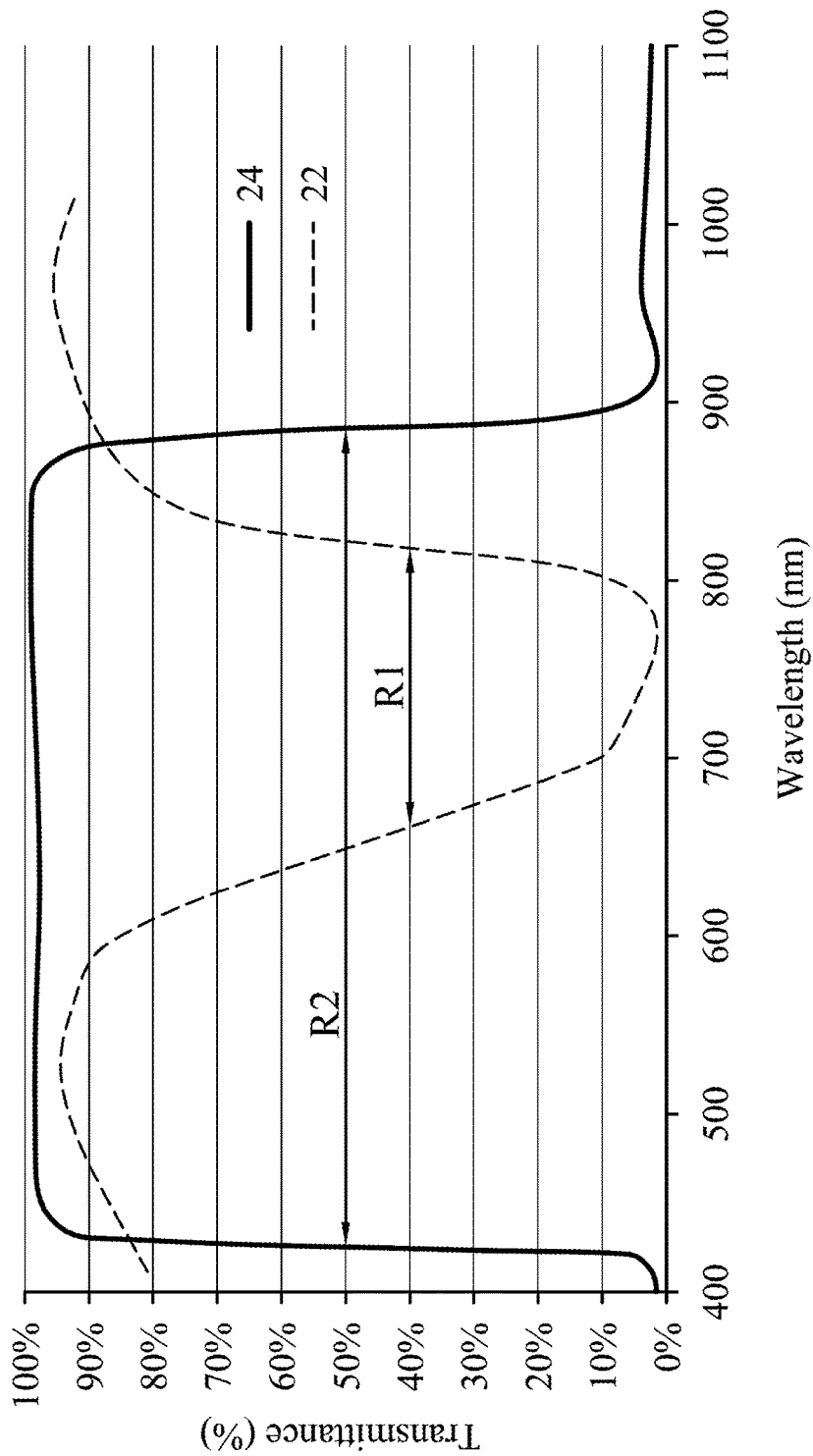
FIG. 8A shows the relationship between the transmittance (% T) and the wavelength (nm) of light with regard to the first filter and the second filter in accordance with one embodiment of the invention.

In some embodiments, referring to FIG. 8A, the first wavelength range R1 of the infrared (IR) light blocked by the first filter 22 is from about 700 nm to about 800 nm or from about 700 nm to about 900 nm. That is, the first filter 22 selectively blocks the infrared (IR) light which has a wavelength ranging from about 700 nm to about 800 nm (see a curve 22 presented by the first filter 22 in FIG. 8A). FIG. 8A shows the relationship between the transmittance (% T) and the wavelength (nm) of light with regard to the first filter 22 and the second filter 24.

In some embodiments, the second wavelength range R2 of the visible light and the infrared (IR) light transmitted allowed by the second filter 24 is from about 400 nm to about 900 nm or from about 400 nm to about 1,000 nm. That is, the second filter 24 selectively allows transmission of the visible light and the infrared (IR) light which have wavelengths ranging from about 400 nm to about 900 nm (see a curve 24 presented by the second filter 24 in FIG. 8A). Specifically, when the first filter 22 and the second filter 24 are hybridized, a dual band pass profile is fouled due to the second wavelength range R2 being larger than the first wavelength range R1.

In some embodiments, the second filter 24 may comprise multiple films, for example, six films 24a, 24b, 24c, 24d, 24e and 24f with alternating high and low refractive index, as shown in FIG. 7, and a specific metal film, such like Ag, Al . . . etc.

In some embodiments, the image-sensor structure 10 further comprises a third filter 30 blocking infrared (IR) light formed between the red color filters 16a, the green color filters 16b and the blue color filters 16c, and the substrate 12.

Figure 8B:
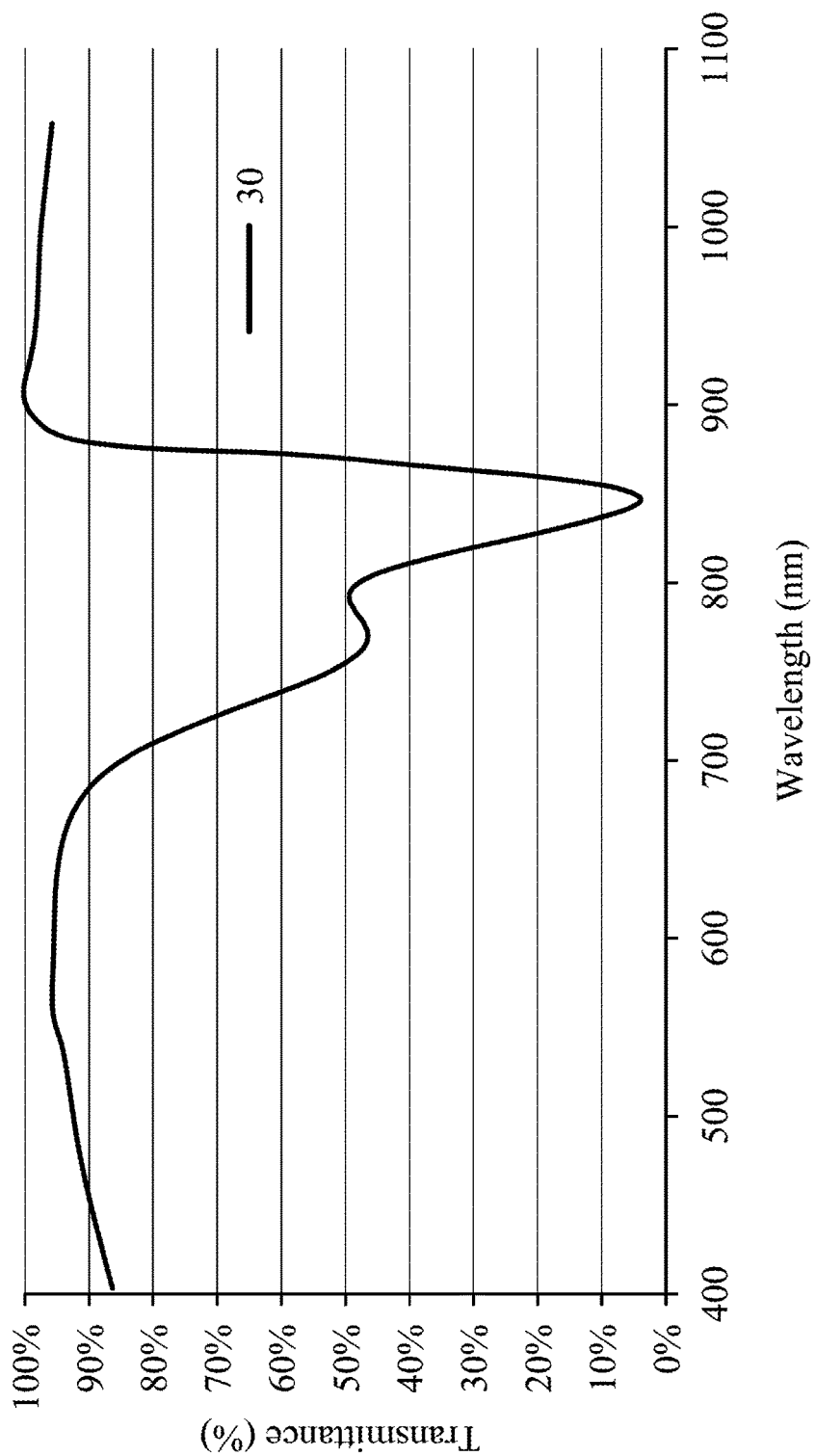
FIG. 8B shows the relationship between the transmittance (% T) and the wavelength (nm) of light with regard to the third filter in accordance with one embodiment of the invention.

In some embodiments, the third filter 30 blocks the infrared (IR) light having a wavelength of 850 nm (see a curve 30 presented by the third filter 30 in FIG. 8B) or 940 nm. FIG. 8B shows the relationship between the transmittance (% T) and the wavelength (nm) of light with regard to the third filter 30.

In FIG. 7, in the image-sensor structure 10, a hybrid dual band pass filter 28 constituted by the first filter 22 and the second filter 24 is directly disposed on a sensor chip combined with the third filter 30 and is capable of cutting the infrared (IR) light with the specific wavelength (i.e. about 700 nm to about 800 nm, and about 850 nm or about 940 nm) and allowing only the visible light with the specific wavelength (i.e. about 400 nm to about 700 nm) passing through the red color filters 16a, the green color filters 16b and the blue color filters 16c without the infrared (IR) light noise. Similarly, the hybrid dual band pass filter 28 without disposition of the third filter 30 therebelow is capable of allowing the infrared (IR) light with the specific wavelength (i.e. about 850 nm or about 940 nm) passing through the infrared pass filters 16d.

Figure 9:
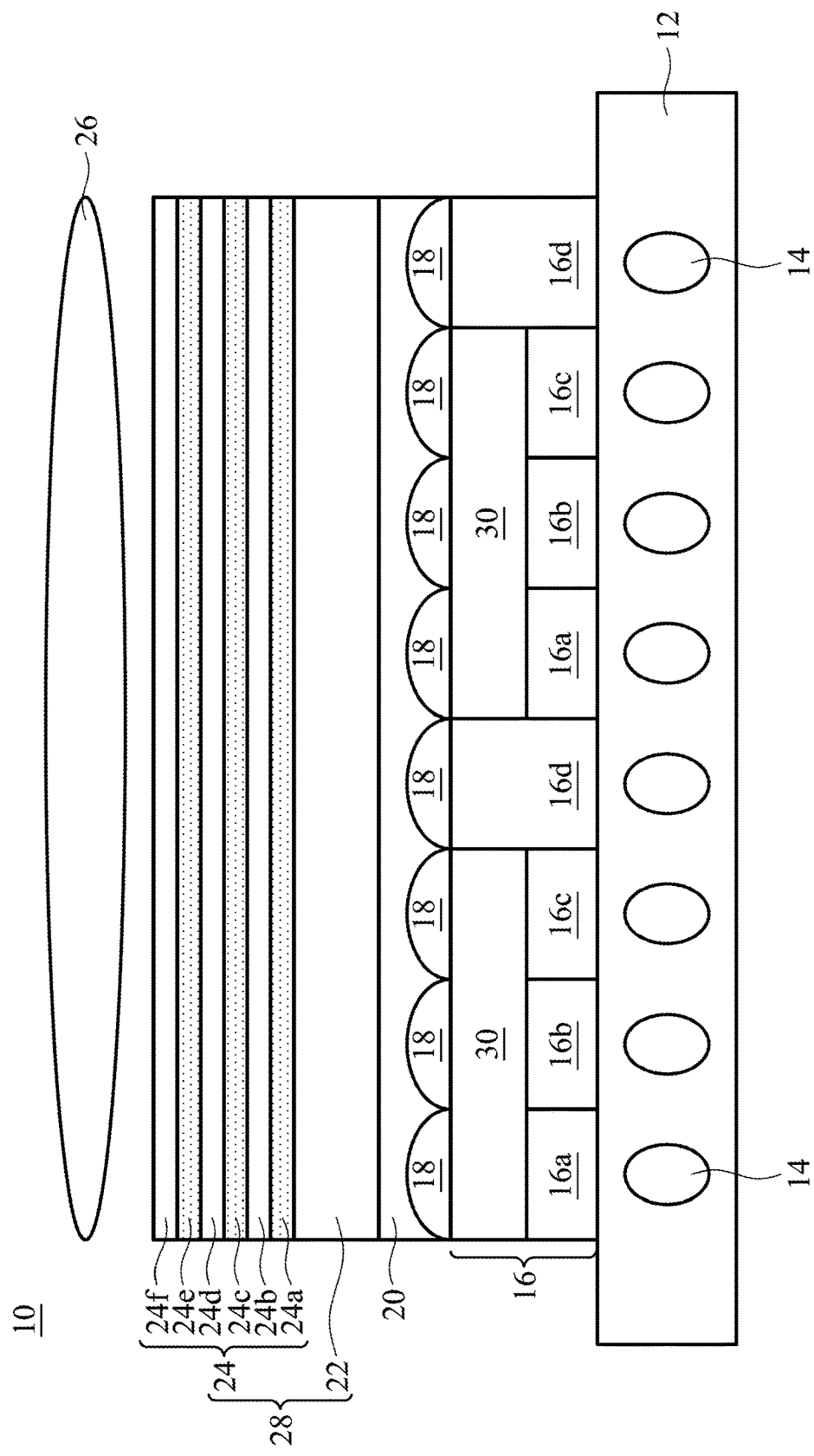
FIG. 9 is a cross-sectional view of an image-sensor structure in accordance with one embodiment of the invention.

Referring to FIG. 9, in accordance with one embodiment of the invention, an image-sensor structure 10 is provided. FIG. 9 is a cross-sectional view of the image-sensor structure 10.

The image-sensor structure 10 comprises a substrate 12 with a plurality of photoelectric conversion units 14 formed in the substrate 12. A plurality of color filters 16 is formed above the substrate 12. The color filters 16 are divided into red color filters 16a, green color filters 16b, blue color filters 16c and infrared pass filters 16d. A plurality of microlenses 18 are correspondingly formed above the color filters 16. A transparent material layer 20 is formed above the microlenses 18. A first filter 22 blocking infrared (IR) light is formed above the transparent material layer 20. The first filter 22 blocks the infrared (IR) light having a first wavelength range. A second filter 24 allowing transmission of visible light and infrared (IR) light is formed above the first filter 22. The second filter 24 allows transmission of the visible light and the infrared (IR) light having a second wavelength range. Specifically, the second wavelength range is larger than the first wavelength range. A lens module 26 is formed above the second filter 24.

In some embodiments, the photoelectric conversion unit 14 may comprise a photodiode (PD).

In some embodiments, the infrared (IR) pass filter 16d allows transmission of infrared (IR) light.

In some embodiments, the transparent material layer 20 may have a refractive index which is about lower than the refractive index of the microlens 18 and the first filter 22.

In some embodiments, the transparent material layer 20 may have a refractive index which is about lower than 1.3, for example, about lower than the refractive index of silicon oxide.

In some embodiments, referring to FIG. 8A, the first wavelength range R1 of the infrared (IR) light blocked by the first filter 22 is from about 700 nm to about 800 nm or from about 700 nm to about 900 nm. That is, the first filter 22 selectively blocks the infrared (IR) light which has a wavelength ranging from about 700 nm to about 800 nm (see a curve 22 presented by the first filter 22 in FIG. 8A). FIG. 8A shows the relationship between the transmittance (% T) and the wavelength (nm) of light with regard to the first filter 22 and the second filter 24.

In some embodiments, the second wavelength range R2 of the visible light and the infrared (IR) light transmitted allowed by the second filter 24 is from about 400 nm to about 900 nm or from about 400 nm to about 1,000 nm. That is, the second filter 24 selectively allows transmission of the visible light and the infrared (IR) light which have wavelengths ranging from about 400 nm to about 900 nm (see a curve 24 presented by the second filter 24 in FIG. 8A). Specifically, when the first filter 22 and the second filter 24 are hybridized, a dual band pass profile is formed due to the second wavelength range R2 being larger than the first wavelength range R1.

In some embodiments, the second filter 24 may comprise multiple films, for example, six films 24a, 24b, 24c, 24d, 24e and 24f with alternating high and low refractive index, as shown in FIG. 9, and a specific metal film, such like Ag, Al . . . etc.

In some embodiments, the image-sensor structure 10 further comprises a third filter 30 blocking infrared (IR) light formed between the red color filters 16a, the green color filters 16b and the blue color filters 16c, and the microlenses 18.

In some embodiments, the third filter 30 blocks the infrared (IR) light having a wavelength of 850 nm (see a curve 30 presented by the third filter 30 in FIG. 8B) or 940 nm. FIG. 8B shows the relationship between the transmittance (% T) and the wavelength (nm) of light with regard to the third filter 30.

In FIG. 9, in the image-sensor structure 10, a hybrid dual band pass filter 28 constituted by the first filter 22 and the second filter 24 is directly disposed on a sensor chip combined with the third filter 30 and is capable of cutting the infrared (IR) light with the specific wavelength (i.e. about 700 nm to about 800 nm, and about 850 nm or about 940 nm) and allowing only the visible light with the specific wavelength (i.e. about 400 nm to about 700 nm) passing through the red color filters 16a, the green color filters 16b and the blue color filters 16c without the infrared (IR) light noise. Similarly, the hybrid dual band pass filter 28 without disposition of the third filter 30 thereabove is capable of allowing the infrared (IR) light with the specific wavelength (i.e. about 850 nm or about 940 nm) passing through the infrared pass filters 16d.

While the invention has been described by way of example and in terms of preferred embodiment, it is to be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An image-sensor structure, comprising:
    a substrate with a plurality of photoelectric conversion units formed therein;
    a plurality of color filters formed above the substrate, wherein the color filters are divided into red color filters, green color filters, blue color filters and infrared pass filters;
    a plurality of microlenses correspondingly formed above the color filters;
    a first transparent material layer formed above the microlenses;
    a first filter blocking infrared (IR) light partially formed above the first transparent material layer, exposing a part of the first transparent material layer corresponding to the infrared pass filters;
    a second filter allowing transmission of visible light formed above the first filter, exposing the part of the first transparent material layer corresponding to the infrared pass filters;
    a second transparent material layer formed above the part of the first transparent material layer corresponding to the infrared pass filters; and
    a lens module formed above the second filter and the second transparent material layer.

2. The image-sensor structure as claimed in claim 1, wherein the first transparent material layer has a refractive index lower than that of the microlens and the first filter.

3. The image-sensor structure as claimed in claim 1, wherein the first transparent material layer has a refractive index lower than 1.3.

4. The image-sensor structure as claimed in claim 1, wherein the first filter blocks the infrared (IR) light having a wavelength ranging from 700 nm to 800 nm, 700 nm to 900 nm, 700 nm to 1,000 nm or 800 nm to 900 nm.

5. The image-sensor structure as claimed in claim 1, wherein the second filter allows transmission of the visible light having a wavelength ranging from 400 nm to 700 nm.

6. The image-sensor structure as claimed in claim 1, wherein the second filter comprises multiple films with alternating high and low refractive index.

7. An image-sensor structure, comprising:
    a substrate with a plurality of photoelectric conversion units formed therein;
    a plurality of color filters fainted above the substrate, wherein the color filters are divided into red color filters, green color filters, blue color filters and infrared pass filters;
    a plurality of microlenses correspondingly formed above the color filters;
    a transparent material layer formed above the microlenses;
    a first filter blocking infrared (IR) light formed above the transparent material layer, wherein the first filter blocks the infrared (IR) light having a first wavelength range;
    a second filter allowing transmission of visible light and infrared (IR) light formed above the first filter, wherein the second filter allows transmission of the visible light and the infrared (IR) light having a second wavelength range, wherein the second wavelength range is larger than the first wavelength range; and
    a lens module formed above the second filter.

8. The image-sensor structure as claimed in claim 7, wherein the transparent material layer has a refractive index lower than that of the microlens and the first filter.

9. The image-sensor structure as claimed in claim 7, wherein the transparent material layer has a refractive index lower than 1.3.

10. The image-sensor structure as claimed in claim 7, wherein the first wavelength range is from 700 nm to 800 nm or from 700 nm to 900 nm.

11. The image-sensor structure as claimed in claim 7, wherein the second wavelength range is from 400 nm to 900 nm or from 400 nm to 1,000 nm.

12. The image-sensor structure as claimed in claim 7, wherein the second filter comprises multiple films with alternating high and low refractive index.

13. The image-sensor structure as claimed in claim 7, further comprising a third filter blocking infrared (IR) light formed between the red color filters, the green color filters and the blue color filters, and the substrate, or between the red color filters, the green color filters and the blue color filters, and the microlenses.

14. The image-sensor structure as claimed in claim 13, wherein the third filter blocks the infrared (IR) light having a wavelength of 850 nm or 940 nm.

* * * * *